(12) United States Patent
Ngo

(10) Patent No.: US 8,466,665 B1
(45) Date of Patent: Jun. 18, 2013

(54) ADAPTIVE DIGITAL PULSE WIDTH MODULATION GENERATOR FOR BUCK CONVERTERS

(75) Inventor: Huy X Ngo, Fremont, CA (US)

(73) Assignee: Adaptive Digital Power, Inc., San Jose, CA (US)

( * ) Notice: Subject to any disclaimer, the term of this patent is extended or adjusted under 35 U.S.C. 154(b) by 378 days.

(21) Appl. No.: 12/889,208

(22) Filed: Sep. 23, 2010

Related U.S. Application Data

(60) Provisional application No. 61/278,107, filed on Oct. 5, 2009, provisional application No. 61/278,108, filed on Oct. 5, 2009, provisional application No. 61/278,109, filed on Oct. 5, 2009, provisional application No. 61/278,127, filed on Oct. 5, 2009, provisional application No. 61/278,128, filed on Oct. 5, 2009, provisional application No. 61/278,129, filed on Oct. 5, 2009.

(51) Int. Cl.
*G05F 1/59* (2006.01)

(52) U.S. Cl.
USPC ............................. 323/271; 323/272; 323/283

(58) Field of Classification Search
USPC .................................. 323/271, 272, 282, 283
See application file for complete search history.

(56) References Cited

U.S. PATENT DOCUMENTS

| | | | | |
|---|---|---|---|---|
| 3,697,860 | A * | 10/1972 | Baker | 323/271 |
| 3,699,358 | A * | 10/1972 | Wilkinson | 327/405 |
| 5,010,470 | A * | 4/1991 | Lipman et al. | 363/132 |
| 5,552,695 | A * | 9/1996 | Schwartz | 323/271 |
| 6,310,469 | B1 | 10/2001 | Bentolila et al. | |
| 6,448,746 | B1 * | 9/2002 | Carlson | 323/272 |
| 7,061,213 | B2 | 6/2006 | Yoshida | |
| 7,173,403 | B1 | 2/2007 | Chen et al. | |
| 7,595,569 | B2 * | 9/2009 | Amerom et al. | 307/82 |
| 7,675,276 | B2 | 3/2010 | Ohkawa et al. | |
| 8,129,962 | B2 * | 3/2012 | Xie et al. | 323/269 |
| 2005/0057238 | A1 | 3/2005 | Yoshida | |
| 2008/0130325 | A1 | 6/2008 | Ye | |
| 2009/0079410 | A1 | 3/2009 | Ohkawa et al. | |
| 2009/0102444 | A1 | 4/2009 | Nonaka | |
| 2009/0315523 | A1 | 12/2009 | Kumagai et al. | |
| 2010/0066328 | A1 | 3/2010 | Shimizu et al. | |
| 2010/0102788 | A1 | 4/2010 | Kuroyabu et al. | |
| 2011/0254520 | A1 * | 10/2011 | Teh et al. | 323/272 |

* cited by examiner

*Primary Examiner* — Jeffrey Sterrett
(74) *Attorney, Agent, or Firm* — Tran & Associates

(57) ABSTRACT

Systems and methods are disclosed to control a buck converter by performing adaptive digital pulse width modulation (ADPWM) with a plurality of upper power transistors each uniquely controlled to enable greater than 100% duty cycle for the buck converter and a lower power transistor coupled to the plurality of upper power transistors; and driving an inductor having one end coupled to the lower power transistor and the upper power transistors.

18 Claims, 7 Drawing Sheets ing to reduce a DC voltage is to use a
ADAPTIVE DIGITAL PULSE WIDTH MODULATION GENERATOR FOR BUCK CONVERTERS This application claims priority to U.S. Provisional Application Ser. Nos. 61/278,107; 61/278,108; 61/278,109; 61/278,127; 61/278,128; and 61/278,129, all of which were filed on Oct. 5, 2009, the contents of which are incorporated by reference.

BACKGROUND

The present invention relates to adaptive digital pulse width control of buck converters.

Switching regulators are commonly used to step-down a higher level, unregulated input voltage to a regulated output voltage. The simplest way to reduce a DC voltage is to use a voltage divider circuit, but voltage dividers waste energy, since they operate by bleeding off excess power as heat; also, output voltage isn't regulated (varies with input voltage). Other types of linear voltage regulators tend to be inefficient. Often, the power devices used in linear voltage regulators must dissipate a large amount of power. Consequently, the linear regulators must be cooled, either by mounting them on heat-sinks or by forced-air cooling (e.g., a fan), resulting in the loss of efficiency. In applications where size and efficiency are critical, linear voltage regulators are generally not used.

In applications requiring DC-DC conversion from a relatively high input voltage, a switching regulator will dramatically improve conversion efficiency relative to linear regulator alternatives. A buck converter, or step-down switch mode power supply, may also be referred to as a switch mode regulator. Buck converters are often used to step down the voltage in a given circuit. Buck converters receive a high direct current (DC) voltage source and, accordingly, output a lower desired DC voltage. Popularity of the buck converter is due to its high efficiency and compact size. The buck converter can be used in place of bulky linear voltage regulators at high voltage inputs.

Conventional buck converters often can include one or more switches, which can be implemented by MOSFETs (Metal-Oxide-Semiconductor-Field-Effect-Transistors). The switches, which are commonly controlled by a multiphase oscillator, can alternate between connecting and disconnecting a voltage source to circuits that drive the desired output. Hence, the duty cycle of the switching determines the output voltage. In addition, a pulse-width modulation (PWM) circuit commonly controls the switching with each switch receiving a different phase of the PWM over the complete period of the oscillator frequency.

FIG. 1 shows an idealized block diagram of a conventional buck converter. A power source 10 such as a battery provides power to be converted. The converter includes an inductor 14 and two switches (usually a transistor 12 and a diode 16) that control the inductor 14. The switch alternates between connecting the inductor 14 to source voltage to store energy in the inductor 14 and discharging the inductor 14 into a load. The load can be modeled as a resistive part 20 and a capacitive part with Rc 22 and capacitor 24.

Buck converters can include multiple parallel channels to process one or more of the voltage sources to drive a common output. Each channel can be substantially similar and often includes at least one inductor. The input terminal of the inductor is switched between the voltage source and ground. The DC current through each inductor is proportional to the duty cycle of its PWM signal and the value of the voltage source.

Each inductor has a current limit. Typically, more PWM circuits are used when more output current is desired. The output terminals of all the inductors are electrically connected to provide a single output of the power conversion circuit. The output terminals of all the inductors are tied together and therefore have at least approximately identical voltages. The input terminal of each inductor has a rectangular wave voltage signal, which is derived from the voltage source and ground. The duty cycles of the rectangular wave voltage signals of respective channels are affected by variations in the respective PWM circuits and switches (e.g., design tolerances, offsets, and timing variations). A slight difference in the duty cycle can produce a significant difference in the DC current through the inductor in each channel. U.S. Pat. No. 7,541,794 discusses a buck converter, having (i) an oscillator, (ii) a pulse width modulator, (iii) and a nonoverlap clock generator and level shifter. The buck converter can convert input voltage ranging from approximately 3V to 5V down to approximately 0.7-1.0V, 1.2V, 1.5V, 1.8V, 2.5V, and 3.3V without the use of resistor dividers.

A typical PWM circuit is limited by 100% duty cycle. In particular, an analog PWM module which used a ramp generator and a comparator, achieving even a 90% duty cycle is difficult to achieve due to the noise and transient.

SUMMARY

In one aspect, an adaptive digital pulse width modulation (ADPWM) generator for a buck converter includes a plurality of upper power transistors each uniquely controlled to enable greater than 100% duty cycle for the buck converter; a lower power transistor coupled to the plurality of upper power transistors; an inductor having one end coupled to the lower power transistor and the upper power transistors; and a load coupled to the inductor.

Implementations of the above aspect may include one or more of the following. Each upper power transistor is connected to a different supply voltage. A bootstrap voltage generator can provide the supply voltage for the upper power transistor. The bootstrap generator can be on-chip. A plurality of upper drivers can be used, each upper driver connected to a respective upper power transistor. A low driver coupled to the lower power transistor. A multiplexer can generate unique control signals for the upper power transistors. The controller can balance current among the upper power transistors. This can be done by limiting current in one upper power transistor while allowing current in remaining upper power transistors to change. Current shedding can be done. For example, the current shedding process can set a loop-gain to a low value to reduce an inductor current to a predetermined value over time.

In another aspect, systems and methods are disclosed to control a buck converter by performing adaptive digital pulse width modulation (ADPWM) with a plurality of upper power transistors each uniquely controlled to enable greater than 100% duty cycle for the buck converter and a lower power transistor coupled to the plurality of upper power transistors; and driving an inductor having one end coupled to the lower power transistor and the upper power transistors.

Implementations of the above aspect may include one or more of the following. The method includes providing each upper power transistor with a different supply voltage. Separate supply voltages can be generated for each upper power transistor using an on-chip bootstrap voltage generator. The system can drive each of the power transistors with a driver circuit. The process can multiplex a master upper power transistor control signal to generate unique control signals for the upper power transistors. The process can automatically balance current among the upper power transistors. This can be done by limiting current in one upper power transistor while allowing current in remaining upper power transistors to change. The process includes shedding current in one of the upper power transistors. The current shedding sets a loop-gain to a low value to reduce an inductor current to a predetermined value over time.

Advantages of the preferred embodiments may include one or more of the following. The digital controller implementation allows much greater flexibility and better utilization of switching power converters. The adaptive DPWM can achieve greater than 100% duty cycle. By being able to hit more than 100% duty cycle, the power regulator controller can respond faster because the effective inductor driven by the buck controller is smaller when one of the upper switches is activated.

Using the adaptive DPWM, the current in a multiphase regulator can be balanced with precision. In a multiphase buck converter arrangement, the adaptive DPWM circuit can provide a variable duty cycle signal to control the switching of each channel. The adaptive DPWM control channels may be synchronous with different phases for each channel. Thus, the adaptive DPWM control channels enable each channel to be switched on a different time. The multiple phases increase an output ripple frequency above the fundamental channel switching frequency. Additionally, the input ripple current is reduced, thereby significantly reducing the input and output capacitors, which can tend to be large and expensive.

DESCRIPTION

Figure 1:
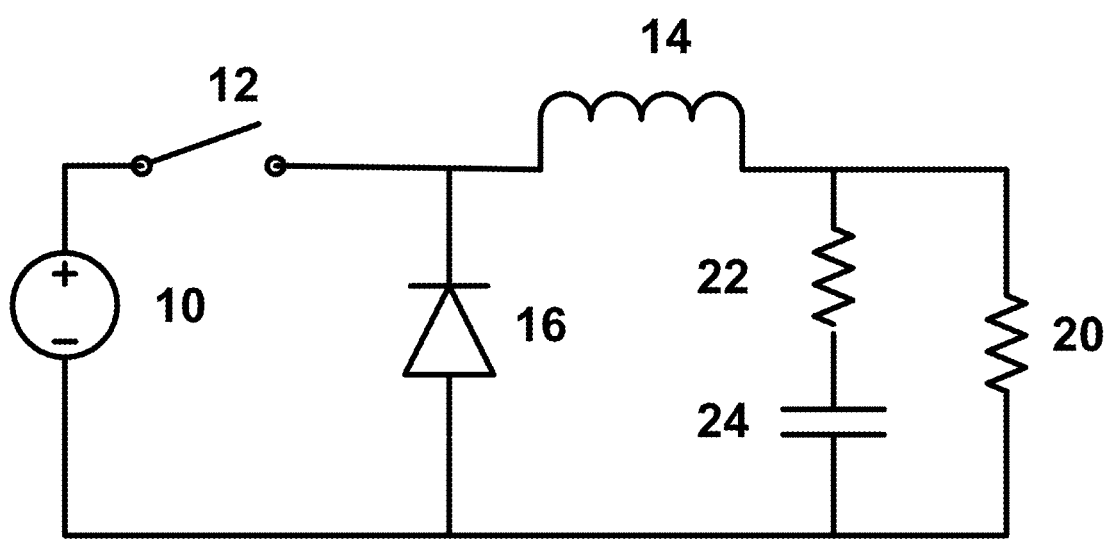
FIG. 1 shows a conventional buck converter.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. In other instances, well-known features have not been described in detail to avoid obscuring the invention.

Figure 2:
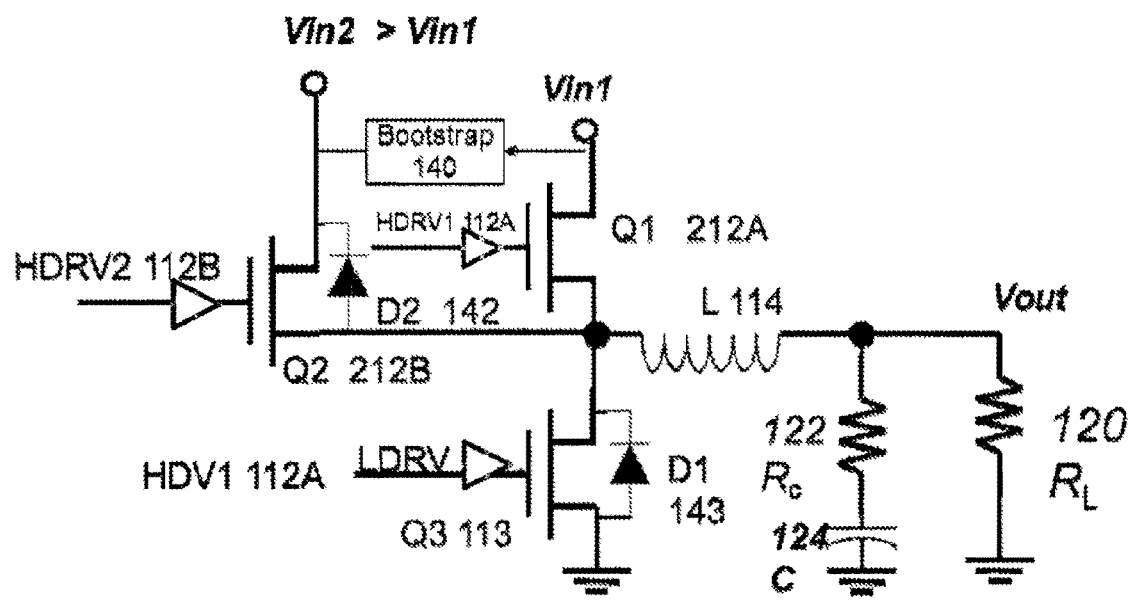
FIG. 2 shows an adaptive digital pulse width modulation generator.
Figure 5:
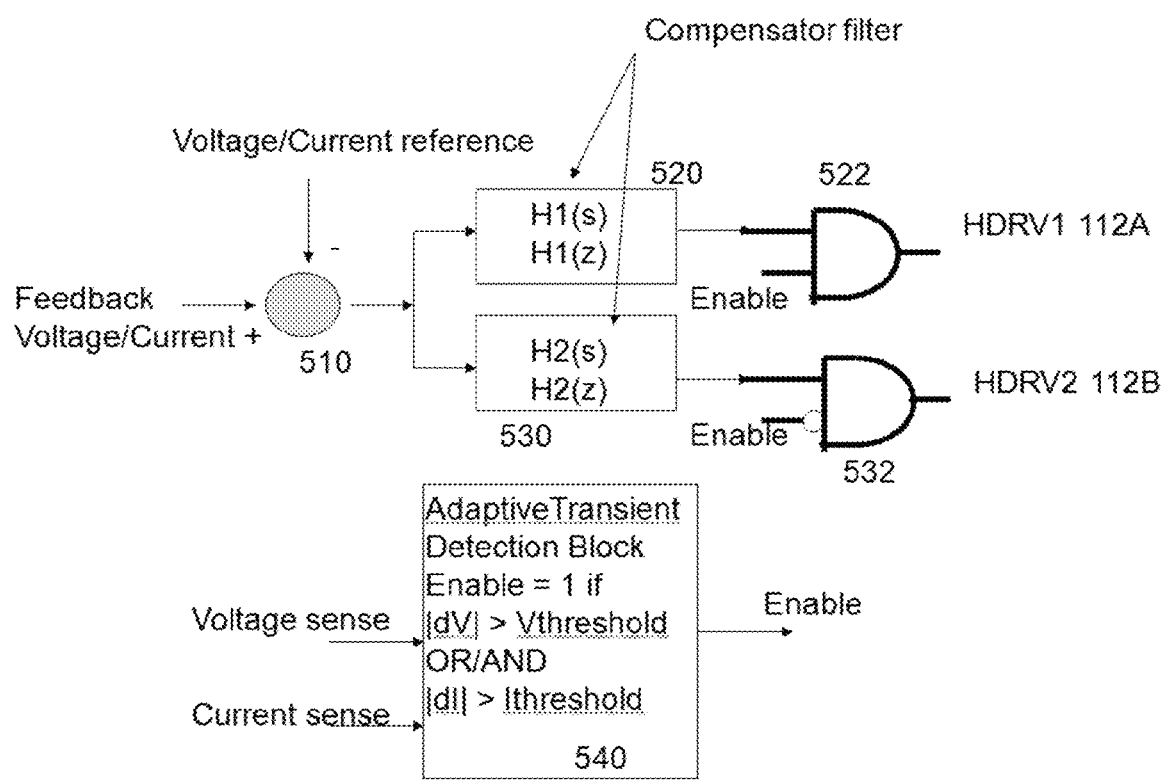
FIG. 5 shows an exemplary adaptive controller for the circuit of FIG. 2.

Turning now to FIG. 2, an adaptive digital pulse width modulation (ADPWM) generator is shown. The ADPWM uses two or more upper switches or transistors 212A-212B with different input voltages. Each upper switch or transistor is controlled by one of unique upper driver signals HDRV1 and HDRV2, which can be generated by a multiplexer from a master upper driver signal HDRV or a controller as shown in FIG. 5. Inductor 114 is connected to the junction where Q1 212A, Q2 212B, and Q3 113 meets. The other end of inductor 114 is connected to resistive load 120 and to capacitive load having Rc 122 and capacitor 124.

Diodes D1 143 and D2 142 are connected to Q2 212B and Q3 113, respectively, and provide the current return path during the dead time of the PWM. D2 142 should be connected to the highest power supply voltage in the system at Vin2. Since Vin2 is greater than Vin1, when Q1 212A is on and Q3 113 and Q2 212B are off, there is no current flow back to Vin2. In particular, Q1 212A does not have a body diode to prevent Vin2 sourcing current to Vin1.

In one example, if Vin1 is 5V is used as a reference for normal operation then 100% duty cycle on Q1 212A will set Vout at 5V. If Vin2 is set at 12 V then 100% duty cycle on Q2 212B will set Vout to be 12V which equivalent to 220% duty cycle on Q1. During the heavy transient response, a digital controller will select Q2 212B first and replace Q2 212B with Q1 212A under a set of pre-defined adaptive criteria which optimized for regulator performance. Because Q2 212B is only activated during transient response, Q2 size is only a fraction of Q1 size.

With a duty cycle greater than 100%, the controller is able to respond faster because the effective inductor is smaller when Q2 is on. In one example, a 2.2 uH inductor will act like 1 uH inductor when Q2 is on. To facilitate higher voltage on Vin2, a simple bootstrap circuit 140 can be used to generate Vin2 internally.

The adaptive DPWM of FIG. 2 addresses a common problem in multiphase regulator that current is not balanced among the switchers. Using the adaptive DPWM of FIG. 2, the current in multiphase regulator can be balanced with precision. In one example for a 4-phase buck regulator, Vin1=5V, Vin2=12V and L=2.2 uH. If the switch with the current exceeds a pre-defined threshold, Q2 will not turn on and loop gain is reduced. Thus, the inductor current in this switch is limited while other switch currents are allowed to increase. Soon other switch(es) will take over as highest current one and become current limited by the digital controller. Current shedding can be done by setting the loop gain to a very low value which will reduce the inductor current over time to a pre-defined value.

Figure 3:
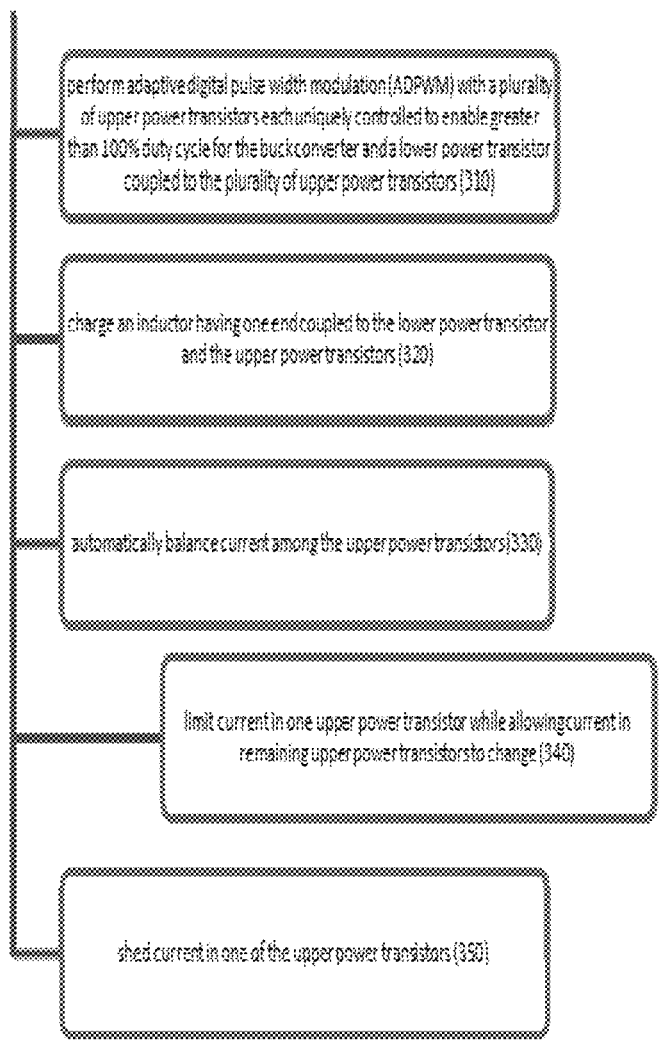
FIG. 3 shows an exemplary process to perform adaptive current balancing for a multiphase regulator.

FIG. 3 shows an exemplary process to perform adaptive current balancing for a multiphase regulator. In Adaptive Current Balancing, the process performs adaptive digital pulse width modulation (ADPWM) with a plurality of upper power transistors each uniquely controlled to enable greater than 100% duty cycle for the buck converter and a lower power transistor coupled to the plurality of upper power transistors (310). Next, the process drives an inductor having one end coupled to the lower power transistor and the upper power transistors (320). Along the way, the process can automatically balance current among the upper power transistors (330) by limiting current in one upper power transistor while allowing current in remaining upper power transistors to change (340). The process can also shed current in one of the upper power transistors (350) by setting a loop-gain to a low value to reduce an inductor current to a predetermined value over time.

Figure 4:
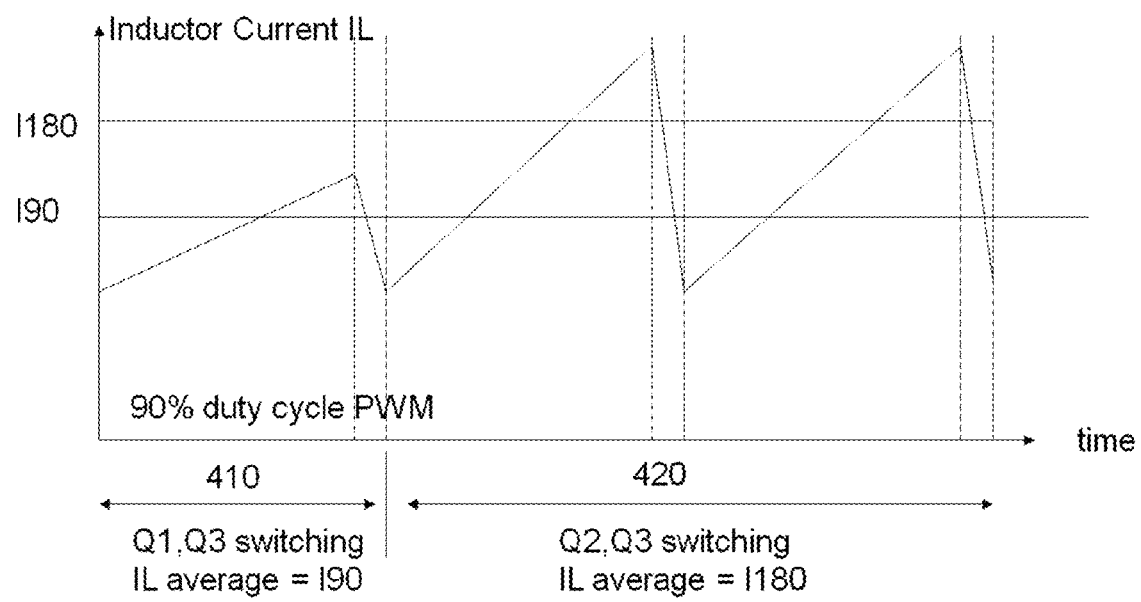
FIG. 4 shows an exemplary chart of current across the inductor of FIG. 2.

FIG. 4 shows an exemplary chart of current across the inductor 114 of FIG. 2. In this example, the pulse width modulation duty cycle is 90%. The chart illustrates the effects when Vin2=2*Vin1, then IL average jump from 90% level (I90) to 180% level (I180) when the Q1 212A and Q3 113 switching pair changes to Q2 212B and Q3 113 pair.

During period 410, Q1 212A and Q3 113 switch with an inductor average current I90, which represents the 90% PWM duty cycle level. During period 420, Q2 212B and Q3 113 switch with an average inductor current I180, which represents the 180% PWM duty cycle level.

FIG. 5 shows an exemplary adaptive controller for the circuit of FIG. 2. In FIG. 5, a feedback voltage or current generator 510 provides voltage or current reference for compensator filters 520 and 530. The output of compensator filter 520 is provided to an AND gate 522 whose output is HDRV1 112A in FIG. 2, while the output of compensator 530 is provided to AND gate 532 to generate the HDRV2 112B output of FIG. 2. Only one of the two AND gates 522 and 532 is turned on at a time using an adaptive transient detector 540. The input to the transient detector is a voltage sense signal and a current sense signal. The Enable output of detector 540 is asserted if the absolute voltage change dV or absolute current change dI exceeds predetermined voltage or current thresholds, respectively.

Figure 6:
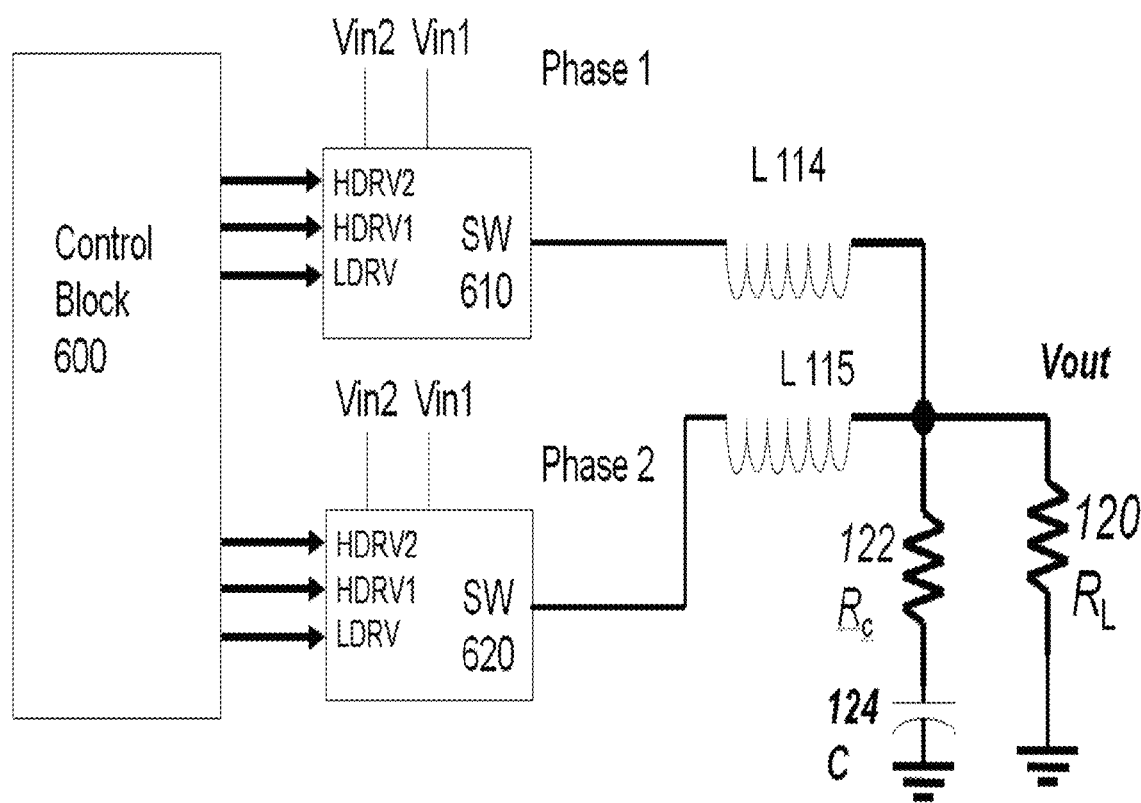
FIG. 6 shows an exemplary embodiment for a multiphase regulator with adaptive current balancing.

FIG. 6 shows an exemplary embodiment for a multiphase regulator with adaptive current balancing. One problem in multiphase regulators is that the current is not balanced among the switchers. The current in multiphase regulator can be balanced with precision using a control block 600 that generates a plurality of power transistor control signals to a plurality of switchers 610 and 620. Switcher 610 is connected to inductor 114, while switcher 620 is connected to inductor 115. The outputs of inductors 114-115 are connected to resistive load 120 and to capacitive load having Rc 122 and capacitor 124.

Figure 7:
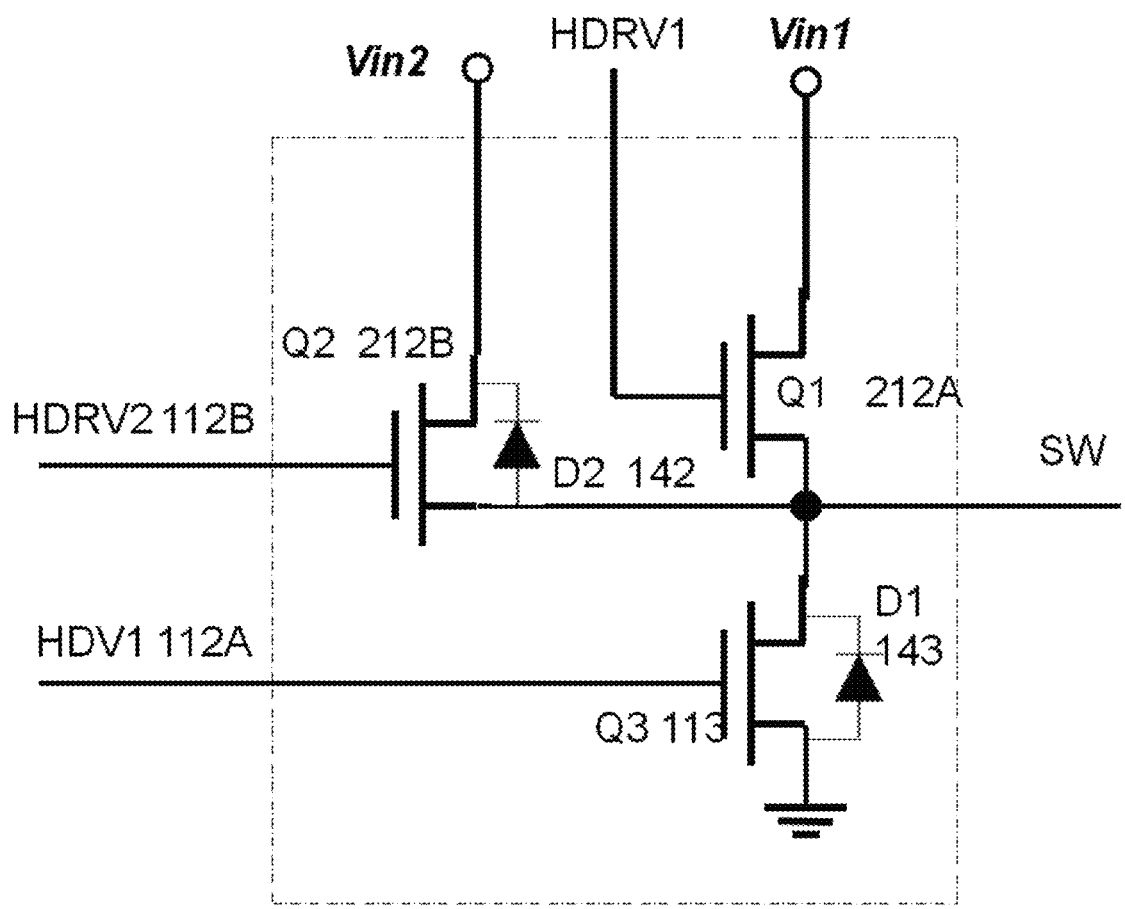
FIG. 7 shows in more details the switcher in FIG. 6.

FIG. 7 shows in more details the switcher 610 or 620. The switcher 610 or 620 uses two or more upper switches or transistors 212A-212B with different input voltages. Each upper switch or transistor is controlled by one of unique upper driver signals HDRV1 and HDRV2. Diodes D1 143 and D2 142 are connected to Q2 212B and Q3 113, respectively, and provide the current return path during the dead time of the PWM. D2 142 should be connected to the highest power supply voltage in the system at Vin2. Since Vin2 is greater than Vin1, when Q1 212A is on and Q3 113 and Q2 212B are off, there is no current flow back to Vin2. In particular, Q1 212A does not have a body diode to prevent Vin2 sourcing current to Vin1.

Next, an exemplary discussion of multiphase adaptive current balancing will be done. In this examplary 2-phase buck regulator, Vin1=5V, Vin2=12V and L=2.2 uH. For the switch with the current exceeds a pre-defined threshold, Q2 212B will not be turn on and loop gain is reduced. So the inductor current in this switch is limited while other switch currents are allowed to increase. Soon some other switch will take over as highest current one and become current limited by the digital controller. Current shedding can be easily done by setting the loop gain to a very low value which will reduce the inductor current over time to pre-defined value.

The above adaptive DPWM provides the digital controller implementation with much greater flexibility and better utilization of switching power converters. Further, using the adaptive DPWM, the current in a multiphase regulator can be balanced with precision.

It is to be understood that the above discussion provides a detailed description of various embodiments. The above descriptions will enable those skilled in the art to make many departures from the particular examples described above to provide apparatuses constructed in accordance with the present disclosure. The embodiments are illustrative, and not intended to limit the scope of the present disclosure. The scope of the present disclosure is rather to be determined by the scope of the claims as issued and equivalents thereto.

What is claimed is:

1. An adaptive digital pulse width modulation (ADPWM) generator for a buck converter, comprising:

a. first and second upper power transistors each uniquely controlled to enable greater than 100% duty cycle for the buck converter;
   b. a lower power transistor coupled to the plurality of upper power transistors;
   c. an inductor having one end coupled to the lower power transistor and the upper power transistors; and
   d. a load coupled to the inductor,
   e. wherein the first upper power transistor is coupled to a body diode and a first voltage and wherein the second upper power transistor is coupled to a second voltage without a body diode to prevent the first voltage from sourcing current to the second voltage.

2. The ADPWM generator of claim 1, wherein each upper power transistor is coupled to a different supply voltage.

3. The ADPWM generator of claim 2, comprising a bootstrap voltage generator to provide the supply voltage for each upper power transistor.

4. The ADPWM generator of claim 1, comprising a plurality of upper drivers, each upper driver coupled to one of the upper power transistors.

5. The ADPWM generator of claim 1, comprising a low driver coupled to the lower power transistor.

6. The ADPWM generator of claim 1, comprising a multiplexer to generate unique control signals for the upper power transistors.

7. The ADPWM generator of claim 1, comprising means for balancing current among the upper power transistors.

8. The ADPWM generator of claim 7, comprising means for limiting current in one upper power transistor while allowing current in remaining upper power transistors to change.

9. The ADPWM generator of claim 1, comprising means for current shedding sets a loop-gain to a low value to reduce an inductor current to a predetermined value over time.

10. A method to control a buck converter, comprising:
    a. performing adaptive digital pulse width modulation (ADPWM) with a plurality of upper power transistors each uniquely controlled to enable greater than 100% duty cycle for the buck converter and a lower power transistor coupled to the plurality of upper power transistors;
    b. charging an inductor through one end coupled to the lower power transistor and the upper power transistors; and
    c. a first upper power transistor coupled to a body diode and a first voltage and a second upper power transistor coupled to a second voltage without a body diode, preventing the first voltage from sourcing current to the second voltage.

11. The method of claim 10, comprising providing each upper power transistor with a different supply voltage.

12. The method of claim 11, comprising generating separate supply voltage for each upper power transistor using an on-chip bootstrap voltage generator.

13. The method of claim 10, comprising driving each of the power transistors with a driver circuit.

14. The method of claim 10, comprising multiplexing a master upper power transistor control signal to generate unique control signals for the upper power transistors.

15. The method of claim 10, comprising automatically balancing current among the upper power transistors.

16. The method of claim 15, comprising limiting current in one upper power transistor while allowing current in remaining upper power transistors to change.

17. The method of claim 10, comprising shedding current in one of the upper power transistors.

18. The method of claim 17, wherein the current shedding sets a loop-gain to a low value to reduce an inductor current to a predetermined value over time.

\* \* \* \* \*